United States Patent [19]
Nakamura et al.

[11] Patent Number: 6,097,058
[45] Date of Patent: Aug. 1, 2000

[54] FERROELECTRIC MEMORY DEVICE AND A METHOD OF MANUFACTURING THEREOF

[75] Inventors: Takashi Nakamura; Yoshikazu Fujimori, both of Kyoto, Japan

[73] Assignee: Rohm Co., Ltd., Kyoto, Japan

[21] Appl. No.: 09/235,714

[22] Filed: Jan. 22, 1999

Related U.S. Application Data

[63] Continuation of application No. PCT/JP98/02207, May 18, 1998.

[30] Foreign Application Priority Data

May 23, 1997 [JP] Japan .................................... 9-133965

[51] Int. Cl.$^7$ .................................................. H01L 29/788
[52] U.S. Cl. .......................... 257/316; 257/295; 257/310; 257/410; 257/411
[58] Field of Search .................................... 257/295, 296, 257/316, 310, 410, 411; 438/3

[56] References Cited

FOREIGN PATENT DOCUMENTS 9-213899  8/1997  Japan .

OTHER PUBLICATIONS

The 43th Preprints of the Joint Congress of applied Physics (1996) No. 2 p. 409.

Technical Research Report of IEICE (1993) vol. 93 No. 350, pp. 53–59.

Nanamatsu, et al.; "Crystallographic and Dielectric Properties of Ferroelectric $A_2B_2O_7$(A=Sr B=Ta, Nb) Crystals and Their Solid Solutions"; *Journal of the Physical Society of Japan*; Mar. 1975; vol. 3, No. 3, pp. 817–824.

Primary Examiner—J. Carroll
Attorney, Agent, or Firm—Merchant & Gould P.C.

[57] ABSTRACT

A ferroelectric layer having a low dielectric constant which is used for a ferroelectric memory element is provided. Also, the ferroelectric layer having a high melting point used for the ferroelectric memory element is provided. An FET 20 has a stacked structure including a gate oxidation layer 24, a floating gate 26, a ferroelectric layer 28, and a control gate 30 deposited on a channel region CH in that order, the channel region CH being formed in a semiconductor substrate 22 made of silicon. The ferroelectric layer 28 consists of a thin film made of a mixed crystal composed of $Sr_2(Ta_{1-x}Nb_x)_2O_7$. The crystal structure of both $Sr_2Nb_2O_7$ and $Sr_2Ta_2O_7$ is pyramid quadratic structure, and their lattice constants are similar to each other. Their relative dielectric constants are low, and their melting points are high. Curie temperature related with their ferroelectricity is, however, too high in $Sr_2Nb_2O_7$ and too low in $Sr_2Ta_2O_7$. In order to overcome the discrepancies, the ferroelectric layer 28 having desired curie temperature is formed with a mixed crystal made of $Sr_2(Ta_{1-x}Nb_x)_2O_7$.

12 Claims, 13 Drawing Sheets

20:FET
22:SILICON SEMICONDUCTOR SUBSTRATE
24:GATE OXIDATION LAYER
26:FLOATING GATE
28:FERROELECTRIC LAYER
30:CONTROL GATE
CH:CHANNEL REGION

20:FET
22:SILICON SEMICONDUCTOR SUBSTRATE
24:GATE OXIDATION LAYER
26:FLOATING GATE
28:FERROELECTRIC LAYER
30:CONTROL GATE
CH:CHANNEL REGION

FIG.6

| | | $Sr_2Nb_2O_7$ | $Sr_2Ta_2O_7$ |
|---|---|---|---|
| CRYSTAL STRUCTURE | | PYRAMID QUADRATIC | PYRAMID QUADRATIC |
| LATTICE CONSTANT | a (Å) | 3.993 | 3.937 |
| LATTICE CONSTANT | b (Å) | 26.726 | 27.198 |
| LATTICE CONSTANT | c (Å) | 5.683 | 5.692 |
| MELTING POINT | $T_m$ (°C) | 1700 | 2000 |
| CURIE TEMPERATURE | $T_c$ (°C) | 1342 | −107 |
| REMANENT POLARIZATION | $P_r$ (μC/cm$^2$) | 9 | 1.9 a) |
| COERCIVE FIELD | $E_c$ (kV/cm) | 6 | 0.4 a) |
| RELATIVE DIELECTRIC CONSTANT | $\varepsilon\ a$ | 75 | 37 |
| RELATIVE DIELECTRIC CONSTANT | $\varepsilon\ b$ | 46 | 22 |
| RELATIVE DIELECTRIC CONSTANT | $\varepsilon\ c$ | 43 | 644 |

CRYSTALLOGRAPHIC AND ELECTRIC CHARACTERISTICS OF $Sr_2Nb_2O_7$, $Sr_2Ta_2O_7$ a) AT A TEMPERATURE OF LIQUID NITROGEN

<PRIOR ART>

FERROELECTRIC MEMORY DEVICE AND A METHOD OF MANUFACTURING THEREOF

This application is a continuation of PCT/JP98/02207 filed May 18, 1998.

CROSS-REFERENCE TO RELATED APPLICATION

The entire disclosure of Japanese Patent Application No. Hei 9-133965 filed on May 23, 1997 including specification, claims drawings and summary is incorporated herein by reference in its entirety.

FIELD OF THE INVENTION

The present invention relates to a ferroelectric memory device, more specifically, to ferroelectric materials used for a ferroelectric memory device.

BACKGROUND ART

Field effect transistors (FETs) using a ferroelectric layer is proposed as a nonvolatile memory device. An example of an FET using a PZT ($PBZr_x Ti_{1-x}O_3$) is shown in FIG. 13. The FET 12 shown in FIG. 13 is a kind of FET having a structure so called MFMIS (Metal Ferroelectric Metal Insulator Silicon). The FET 12 is formed by means of disposing a gate oxidation layer 4, a floating gate 6, a ferroelectric layer 8, and a control gate 10 in that order on a channel region CH formed in a semiconductor substrate 2.

The polarization of the ferroelectric layer 8 is turned over when a positive voltage +V is applied to the control gate 10 while grounding the substrate 2 of the FET 12 (an N channel substrate). Negative electric charges are established in the channel region CH as a result of a remanence polarization remaining in the ferroelectric layer 8 even when the positive voltage +V no longer is applied to the control gate 10. A condition that the negative electric charges are in the channel region CH corresponds to data "1".

On the contrary, occurrence of another polarization reversal in the opposite polarity is observed when a negative voltage −V is applied to the control gate 10. Positive electric charges are generated in the channel region CH as a result of a remanence polarization remaining in the ferroelectric layer 8 even when the negative voltage −V no longer is applied to the control gate 10. Another condition that the positive electric charges are in the channel region CH corresponds to data "0". Either of data "1" or data "0" is stored in the FET 12 by carrying out the procedures described above.

In order to read out the data being stored therein, a readout voltage Vr is applied to the control gate 10. The readout voltage Vr is set at a value between the threshold voltage Vth1 of the FET 12 which is defined when the data "1" is stored and the threshold voltage VthO of the FET 12 which is defined when the data "0" is stored. Judgement of the stored data, either in "1" or "0" can be carried out by detecting whether a drain current predetermined flows or not when the readout voltage Vr is applied to the control gate 10. The stored data is never erased after reading out the data.

Thus, nondestructive readout can be carried out using the FET including a ferroelectric layer. Further, such device is capable of composing one memory cell.

However, the FET using the ferroelectric described above has the following problems to be resolved. The FET 12 is considered in a condition that a capacitor Cf (capacity Cf) which includes the ferroelectric layer 8 and a capacitor Cox (capacity Cox) having the gate oxidation layer 4 is connected in series during the writing (see FIG. 2). Under the circumstances, a divided voltage Vf defined by the following equation is applied to the capacitor Cf when a voltage (equal to either of +V or −V) is applied at a point located between the substrate 2 and the control gate 10, $$Vf = Cox/(Cf+Cox) \cdot V.$$

On the other hand, in order to cause the polarization reversal of the ferroelectric layer 8 during the writing, the divided voltage Vf needs to be a large value. And, the capacitance of the capacitor Cf should be a small value relative to that of the capacitor Cox as in is clear from the equation shown in above. The relative dielectric constant (200 to 1,000) of the PZT composing the ferroelectric layer 8 is much higher than the relative dielectric constant (3.9) of the $Sio_2$ which composes the gate oxidation layer 4.

Consequently, it is difficult to increase the divided voltage Vf shown above. It is therefore, not easy to cause polarization reversal of the ferroelectric layer 8 during the writing. The melting point of PZT is at a low temperature (800 to 900° C.) because PZT contains Pb. This leads to lattice defects in an FET requiring heat treatment after forming a ferroelectric layer. A similar problem to PZT may be observed in a ferroelectric material using bismuth (Bi).

DISCLOSURE OF THE PRESENT INVENTION

It is an object of the present invention to overcome the above mentioned drawbacks associated with the prior arts, and to provide a ferroelectric layer having a low dielectric constant which is used for a ferroelectric memory element. It is another object of the present invention to provide a ferroelectric layer having a high melting point which is used for a ferroelectric memory element.

In accordance with characteristics of the present invention, there is provided a ferroelectric memory device including a ferroelectric layer in which information being stored uses hysteresis characteristics, wherein the ferroelectric layer is composed of a mixed crystal defined by expressions of;

$A1_{y1} A2_{y2} \ldots An_{yn})_2 (B1_{x1} B2_{x2} \ldots Bm_{xm})_2 O_7$, and wherein $x1+x2+ \ldots +xm=1$, and wherein $y1+y2+ \ldots +yn=1$, and wherein each of x1,x2, ... xm, y1,y2, ... yn has a value equal to or greater than 0, and equal to or less than 1, and wherein at least two of x1,x2, ... xm, y1,y2, ... yn have values greater than 0, and less than 1, and wherein each of A1, A2, ... , An is an element selected so as to be different from one another from a group consisting of elements belonging to IIa group, IIIa group, and lanthanum series, and wherein each of B1, B2, ... , Bn is an element selected so as to be different from one another from a group consisting of Ti, Nb, Ta, Zr, Hf, Y.

Also, in accordance with characteristics of the present invention, there is provided a method of manufacturing the ferroelectric memory device defined in claim 7, the method comprising the steps of:

providing the ferroelectric layer by carrying out a step (d) after forming an amorphous layer having a desired thickness by carrying out steps (a) to (c) for one of once and predetermined times, (a) coating mixed-metal alkoxide composed of Sr, Ta, and Nb which being dissolved in a solvent on a base substance, (b) evaporating the solvent,
(c) removing organic elements by heat treatment,
(d) carrying out annealing for crystallization at a temperature above a temperature to be crystallized.

While the novel features of the invention are set forth in a general fashion, both as to organization and content, the invention will be better understood and appreciated, along with other objects and features thereof, from the following detailed description taken in conjunction with the drawings.

BRIEF DESCRIPTION OF THE DRAWINGS

FIG. 6 is a table showing both crystallographical and electric characteristics of $Sr_nNb_2O_7$ and $Sr_2Ta_2O_7$.

THE BEST MODE OF PREFERRED EMBODIMENT TO CARRY OUT THE PRESENT INVENTION

Figure 1:
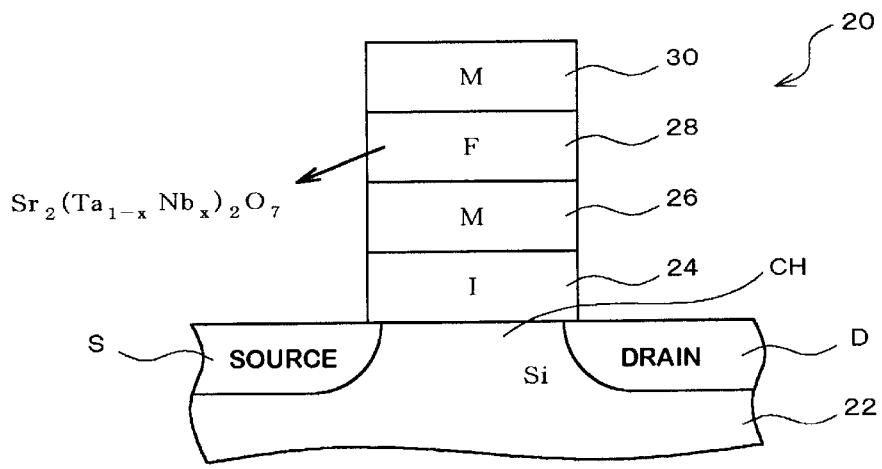
FIG. 1 is a view showing a construction of an FET 20 having an MFMIS structure which forms a ferroelectric memory device in an embodiment of the present invention.

A view showing a construction of an FET 20 having an MFMIS structure which forms a ferroelectric memory device in an embodiment of the present invention is depicted in FIG. 1. The FET 20 comprises a source region S and a drain region D, both formed in a semiconductor substrate 22 made of silicon.
A channel region CH is formed between the source region S and the drain region D.
A gate oxidation layer 24 acting as an insulation layer is formed on the channel region CH. The gate oxidation layer 24 is made of $SiO_2$. A floating gate 26 forming a lower conductive layer is formed on the gate oxidation layer 24. The floating gate 26 has a stacked structure of $Pt/IrO_2$.

On the floating gate 26, a ferroelectric layer 28 described later is disposed. A control gate 30 acts as an upper conductive layer which is formed on the ferroelectric layer 28. The control gate 30 is made of Pt.

Figure 2:
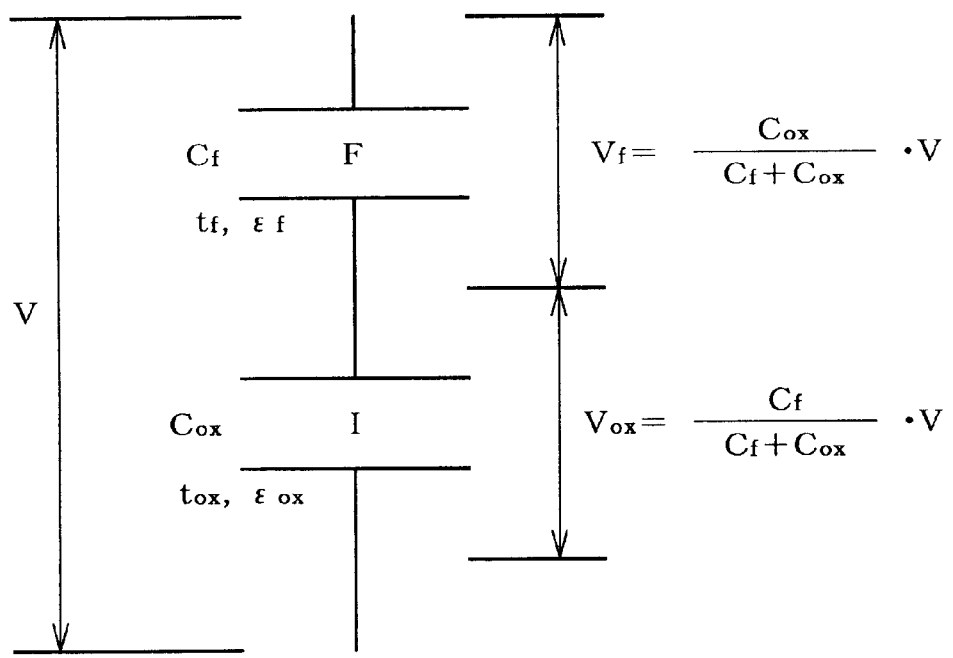
FIG. 2 is a diagram showing an equivalent circuit of the FET 20 during the writing.

Next, an equivalent circuit of the FET 20 during the writing is diagrammed in FIG. 2. The equivalent circuit of the FET 20 during the writing is in a formation connecting a capacitor Cf (capacity Cf) which includes the ferroelectric layer 28 and a capacitor Cox (capacity Cox) having the gate oxidation layer 24 in series. Under the circumstances, a divided voltage Vf defined by the following equation is applied to the capacitor Cf when a voltage (equal to either of +V or −V) is applied at a point located between the substrate 22 and the control gate 30, $$Vf=Cox/(Cf+Cox)\cdot V.$$

An electric field Ef applied to the capacitor Cf is defined as the following expression when the area of the capacitor Cf and that of the capacitor Cox is set as the same with each other, $$Ef=\epsilon ox/(\epsilon f\cdot tox+\epsilon ox\cdot tf)\cdot V \quad (1)$$

wherein $\epsilon f$ is a relative dielectric constant of a ferroelectric substance, $\epsilon ox$ represents a relative dielectric constant of $SiO_2$, tf is a thickness of the ferroelectric layer, and tox represents a thickness of the gate oxidation layer.

In order to cause a polarization reversal to the opposite polarity within the ferroelectric layer 28, the following expression must be satisfied, $$Ef>\alpha Ec \quad (2)$$

wherein $\alpha Ec$ represents an electric field required for causing a polarization reversal, $\alpha$ is a constant, and Ec represents the coercive field.

The following expression is obtained according to the expressions (1) and (2), $$\epsilon ox/(\epsilon f\cdot tox+\epsilon ox\cdot tf)\cdot V>\alpha Ec \quad (3)$$

In order to increase the value of the left member of the expression (3) that is the electric field Ef applied to the capacitor Cf, either decreasing the relative dielectric constant $\epsilon f$ or making the thickness tf of the ferroelectric layer 28 and/or the thickness tox of the gate oxidation layer 24 thinner should be done. However, there is a limitation of making the thickness tox of the gate oxidation layer 4 thinner.

Figure 3:
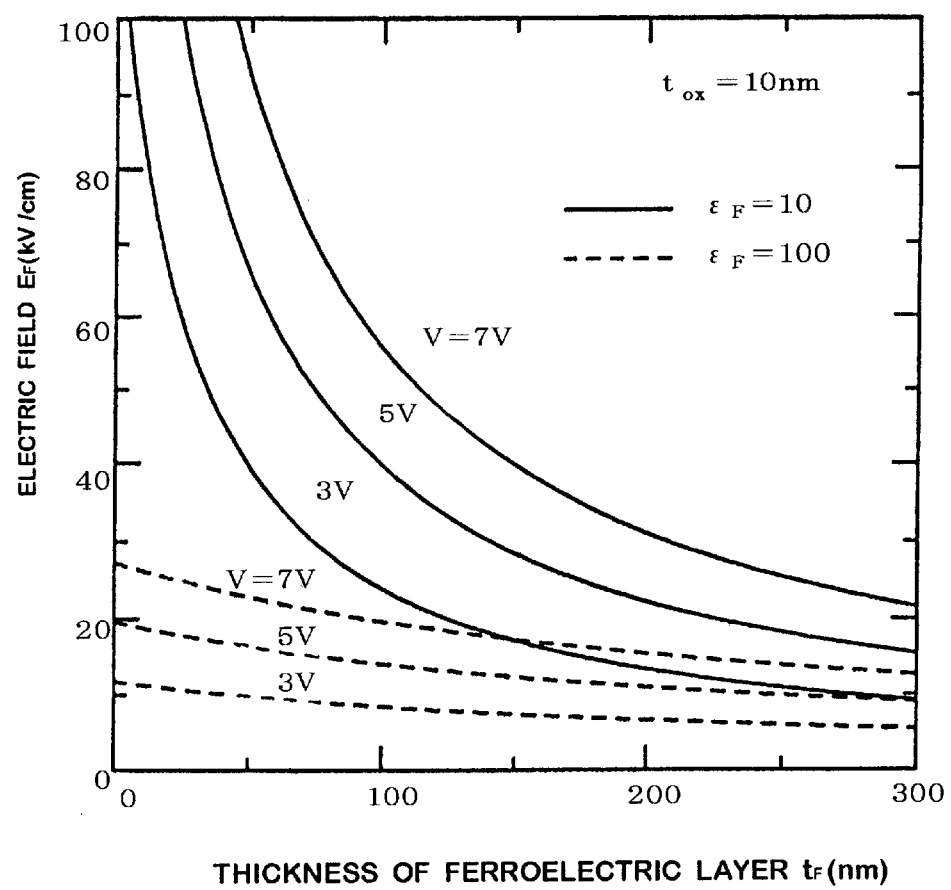
FIG. 3 is a graph showing a relationship between thicknesses tf of a ferroelectric layer 28 and electric fields Ef applied to a capacitor Cf.

FIG. 3 is a graph showing a relationship between thicknesses tf of a ferroelectric layer 28 and electric fields Ef applied to the capacitor Cf when the thickness tox of the gate oxidation layer 24 is fixed to 10 nm as well as using voltages V applied at a point located between the substrate 22 and the control gate 30 as a parameter. Solid curves show the relationship when the relative dielectric constant $\epsilon f$ of the ferroelectric substance is 10, dashed curves illustrate the relationship when the relative dielectric constant $\epsilon f$ of the ferroelectric substance is 100.

As it is understood from FIG. 3, no significant increase of the electric fields Ef is observed when the relative dielectric constant $\epsilon f$ of the ferroelectric substance is 100 even if the thickness tf of the ferroelectric layer 28 is made thinner. On the contrary, significant increase of the electric fields Ef is observed when the relative dielectric constant $\epsilon f$ of the ferroelectric substance is 10 in the case of making the thickness tf of the ferroelectric layer 28 thinner. In other words, it is necessary to make the thickness tf of the ferroelectric layer 28 thinner while decreasing the relative dielectric constant $\epsilon f$ in order to increase the electric fields Ef.

The expression (3) may be formulized in another expression shown below, $$V/\alpha > Ec \cdot \epsilon f / \epsilon ox \cdot tox + tf = k1 \quad (4).$$

In order to cause a polarization reversal in the opposite polarity within the ferroelectric layer 28, the expression (4) must be satisfied.

Next, electric fields $\epsilon ox$ being generated in accordance with a divided voltage Vox applied to a capacitor Cox including the gate oxidation layer 24 can be defined by the following expression, $$Eox = \epsilon f / \epsilon ox \cdot Ef.$$

The expression shown above may be expressed as below when the electric field $\alpha Ec$ representing the electric field required for causing the polarization reversal is applied to the capacitor Cf as the electric field Ef, $$Eox = \epsilon f / \epsilon ox \cdot \alpha Ec \quad (5).$$

On the other hand, in order to prevent dielectric breakdown of the gate oxidation 24, the following expression must be satisfied, $$Eox < Ebd \quad (6)$$

wherein Ebd represents strength of the dielectric breakdown of the gate oxidation layer 24.

The following expression is obtained according to the expressions (5) and (6), $$Ebd \cdot \epsilon ox / \alpha > Ec \cdot \epsilon f = k2 \quad (7).$$

In order words, the expression (7) shown above must be satisfied in order to prevent dielectric breakdown of the gate oxidation layer 24.

Figure 4A:
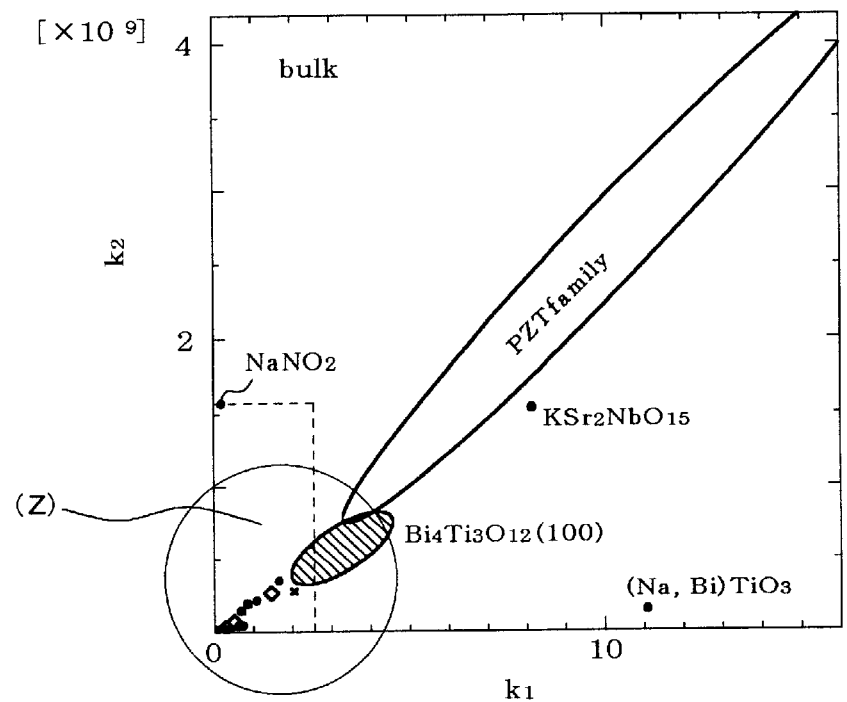
FIG. 4A is a graph being drawn according to plots showing a relationship between k1 and k2 of major ferroelectric substances.

FIG. 4A is a graph being drawn according to plots showing a relationship between k1 used in the expression (4) and k2 used in the expression (7) of major ferroelectric substances. In the graph, some of the values used in these expressions are defined as followings:

tox=15 nm, $\epsilon ox$=3.9, and tf=200 nm.

Another expression shown below is introduced according to the expression (4), $$2.5[v] > k1 \quad (8),$$

when values used in the expression are defined as below,

V=5.0V, $\alpha$=2,

Ebd=8MV/cm, and $\epsilon ox$=3.9.

Further, another expression is defined as below according to the expression (7), $$1.56 \times 10^9 [V/m] > k2 \quad (9).$$

Both the expressions (8) and (9) need to be satisfied in order to cause the polarization reversal of the ferroelectric layer 28 as well as to prevent dielectric breakdown of the gate oxidation layer 24.

Figure 4B:
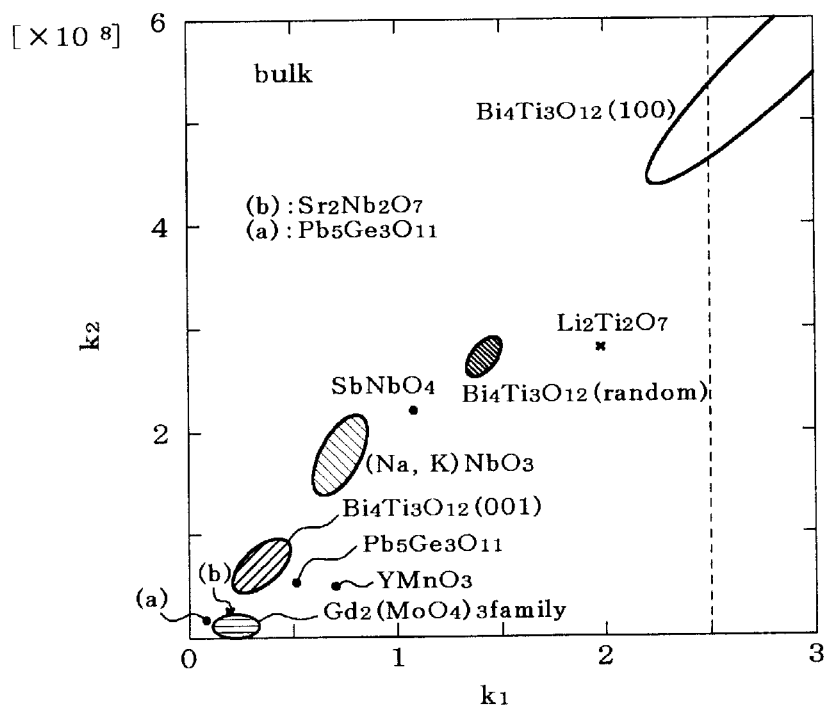
FIG. 4B is an enlarged view of an area (z) of the graph shown in FIG. 4A.

The ferroelectric substances, located in an area (z) illustrated with a dotted line shown in FIG. 4A satisfy the requirements stated above. FIG. 4B is an enlarged view illustrating the vicinity of the area (z).

Further, in order to form the source S and the drain D shown in FIG. 1 by means of self aligning, thermal diffusion of implanted impurities need to be carried out, the impurities being implanted using the ferroelectric layer 28 as a mask after forming the ferroelectric layer 28. Therefore, the ferroelectric layer 28 should be composed of a ferroelectric substance having a high melting point which withstands heat treatments carried out in the vicinity of 800° C.

Figure 5:
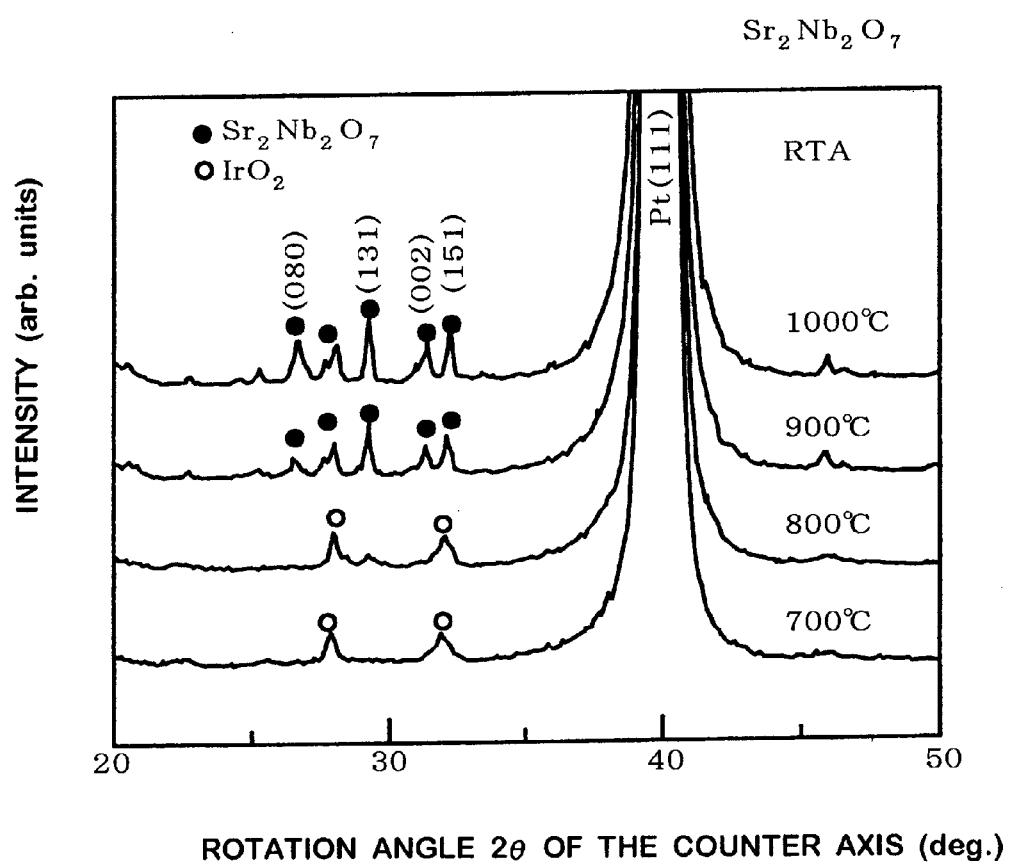
FIG. 5 is a graph showing x-ray diffraction patterns of a memory device being fabricated.

Within various ferroelectric substances, $Sr_2Nb_2O_7$ is selected as a ferroelectric substance having qualities satisfying the requirements described above. A thin film made of $Sr_2Nb_2O_7$ is formed using the Sol-Gel method described later. FIG. 5 is a graph showing x-ray diffraction patterns of a memory device being fabricated using annealing temperatures for crystallization as a parameter. As clearly recognized from FIG. 5, the peaks show unique characteristics of $Sr_2Nb_2O_7$ appearing on the graph when the annealing temperature is equal to or more than 900° C., so that, it is understood that $Sr_2Nb_2O_7$ is in crystallization.

Relative dielectric constant $\epsilon f$ of the thin film made of $Sr_2Nb_2O_7$ thus obtained measured in the vicinity of 45. It is, however, not possible to confirm ferroelectricity (hysteresis characteristics between the voltage applied thereto and the polarization therein) of the film. A curie temperature Tc of the thin film is considered as one of the reasons. Curie temperature is a temperature located at the boundary between temperatures in which a substance indicates ferroelectricity and temperatures in which the substance shows dielectricity. In this connection, the substance indicates ferroelectricity when the temperature of the substance is lower than its curie temperature. It is expected that the thin film made of $Sr_2Nb_2O_7$ shows ferroelectricity at room temperature according to a principle of crystallographical because the curie temperature Tc of $Sr_2Nb_2O_7$ is at 1342° C.

However, no vibrations of lattices are observed (the phenomena is called "suspension of the soft mode") at room temperature. It is considered that the high curie temperature prevents the thin film from the vibrations, so that no ferroelectricity is observed at room temperature. The inventors focused attention on $Sr_2Ta_2O_7$ having the same crystalline structure as that of $Sr_2Nb_2O_7$ and a remarkably lower curie temperature (TC=−107° C.).

Crystallographical and electric characteristics of $Sr_2Nb_2O_7$ and $Sr_2Ta_2O_7$ are listed on a table shown in FIG. 6. The crystal structure of $Sr_2Nb_2O_7$ and $Sr_2Ta_2O_7$ (both of which have pyramid quadratic structure) is similar to each other. Considering these facts, the inventors made a thin film using a mixed crystal made of $Sr_2Nb_2O_7$ and $Sr_2Ta_2O_7$ which satisfied the following condition in experimental basis, $$Sr_2(Ta_{1-x}Nb_x)_2O_7 \quad (10),$$

wherein $0 < x < 1$.

Figure 7:
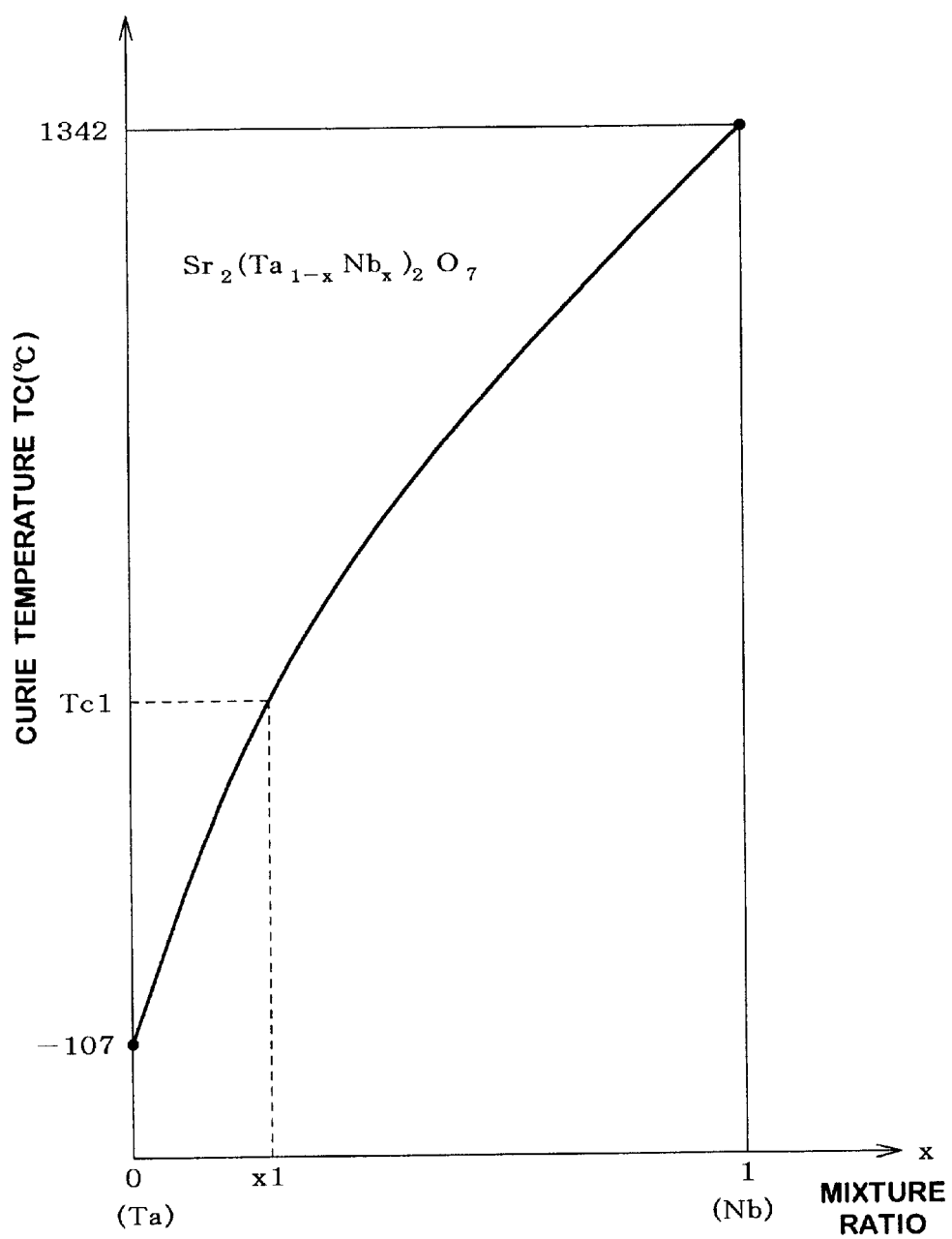
FIG. 7 is a graph showing a relationship between mixture ratios x of Nb in a mixed crystal $Sr_2(Ta_{1-x}Nb_x)_2O_7$ and curie temperature Tc of the mixed crystal.

The mixed crystal consisting of $Sr_2(Ta_{1-x}Nb_x)_2O_7$ changes its crystallographical and electric characteristics consecutively correspondence with its mixture ratio. FIG. 7 is a graph showing a relationship between mixture ratios x of Nb in a mixed crystal $Sr_2(Ta_{1-x}Nb_x)_2O_7$ and a curie temperature of the mixed crystal. It is understood that the mixture ratio x of Nb in the mixed crystal should be x1 in order to obtain a curie temperature of Tc1 according to the graph.

Mixed crystals composed of the substance shown in the expression (10) under a plurality of mixture ratios x such as 0.1, 0.2, 0.3, 0.4, and 0.6 are made respectively. The Sol-Gel method is used for forming a thin film made of the mixed crystal. Processes for forming a thin film made of the mixed crystal under the Sol-Gel method will be described hereunder.

At first, mixed-metal alkoxide composed of Sr, Ta, and Nb, which is dissolved in a solvent is prepared, and the alkoxide thus dissolved is coated on a base substance (this substance becoming the floating gate 26 as a result of patterning, see FIG. 1) having a stacked structure of Pt/IrO$_2$. In this embodiment, 2-metoxyethernol is used for the solvent. The alkoxide is coated by a spin coating method.

The solvent is evaporated at a temperature of 180° C.

Thereafter, in order to remove organic elements, heat treatment using dry air heated at 400° C. is carried out for 30 minutes.

An amorphous layer having a predetermined thickness is formed by carrying out these processes repeatedly. In this embodiment, the processes described above are carried out for a total of four times (four coatings). It is not necessary to repeat the processes as described above, the processes may be carried out just once when the predetermined thickness is much thinner than that above.

Next, annealing for crystallization is carried out to the amorphous layer thus formed. The annealing in this embodiment is carried out by a rapid thermal annealing (RTA) method. That is, heat treatment using O$_2$ within a range of 850 to 1000° C. is carried out for 1 minutes. Thus, the thin film made of the mixed crystal composed of the substance shown in the expression (10) is obtained. The thickness tf of the thin film thus obtained is 145 nm.

Although, various temperatures, durations, and other conditions are described above, the present invention is not limited to the conditions; alternative conditions can be used.

Also, the method for forming the thin film made of the mixed crystal composed of $Sr_2(Ta_{1-x}Nb_x)_2O_7$ is not limited to the Sol-Gel method. Other available methods conventionally used such as spattering method, MOCVD method, MOD method, IBS method, PLD method, and the like can be used for forming the thin film.

Another layer made of Pt (this layer becoming the control gate 30 as a result of patterning, see FIG. 1) is disposed on the thin film thus obtained by carrying out spattering method.

Figure 8:
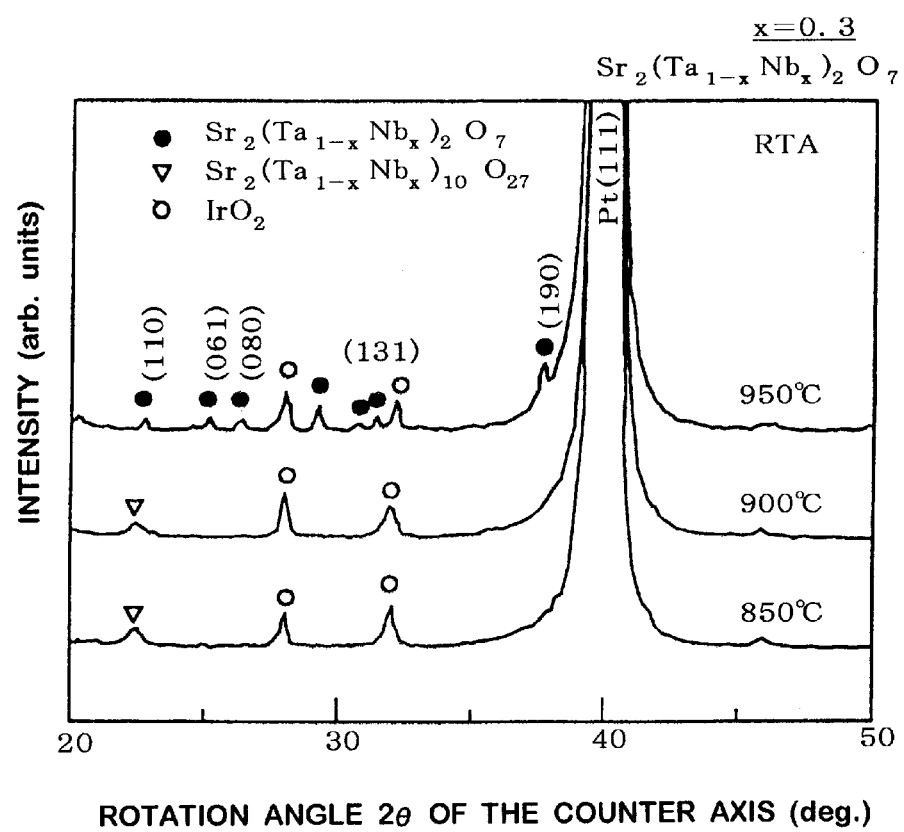
FIG. 8 is a graph showing the x-ray diffraction patterns of the memory device having a ratio x of 0.3.

FIG. 8 is a graph showing the x-ray diffraction patterns of the memory device having a ratio x of 0.3 using the annealing temperatures for crystallization as a parameter. As it is understood from FIG. 8, the peaks show unique characteristics of $Sr_2(Ta_{1-x}Nb_x)_2O_7$ appearing on the graph when the annealing temperature is equal to or more than 950° C., so that, it is understood that $Sr_2(Ta_{1-x}Nb_x)_2O_7$ is in crystallization. In our observation, the surface of the thin film made of $Sr_2(Ta_{1-x}Nb_x)_2O_7$ was very smooth and fine structure in crystallization.

The peaks showing unique characteristics of $Sr_2(Ta_{1-x}Nb_x)_2O_7$ are not observed in the graph when the annealing temperatures are respectively 850° C. and 900° C. Instead of these peaks, other peaks indicating that the substance is $Sr_2(Ta_{1-x}Nb_x)_{10}O_{27}$ shown in the graph are observed. In our experiment, a relationship between the x-ray diffraction patterns of the memory device and the annealing temperatures do not depend on the values of x within a range of $0.1 \leq x \leq 0.6$.

Figure 9:
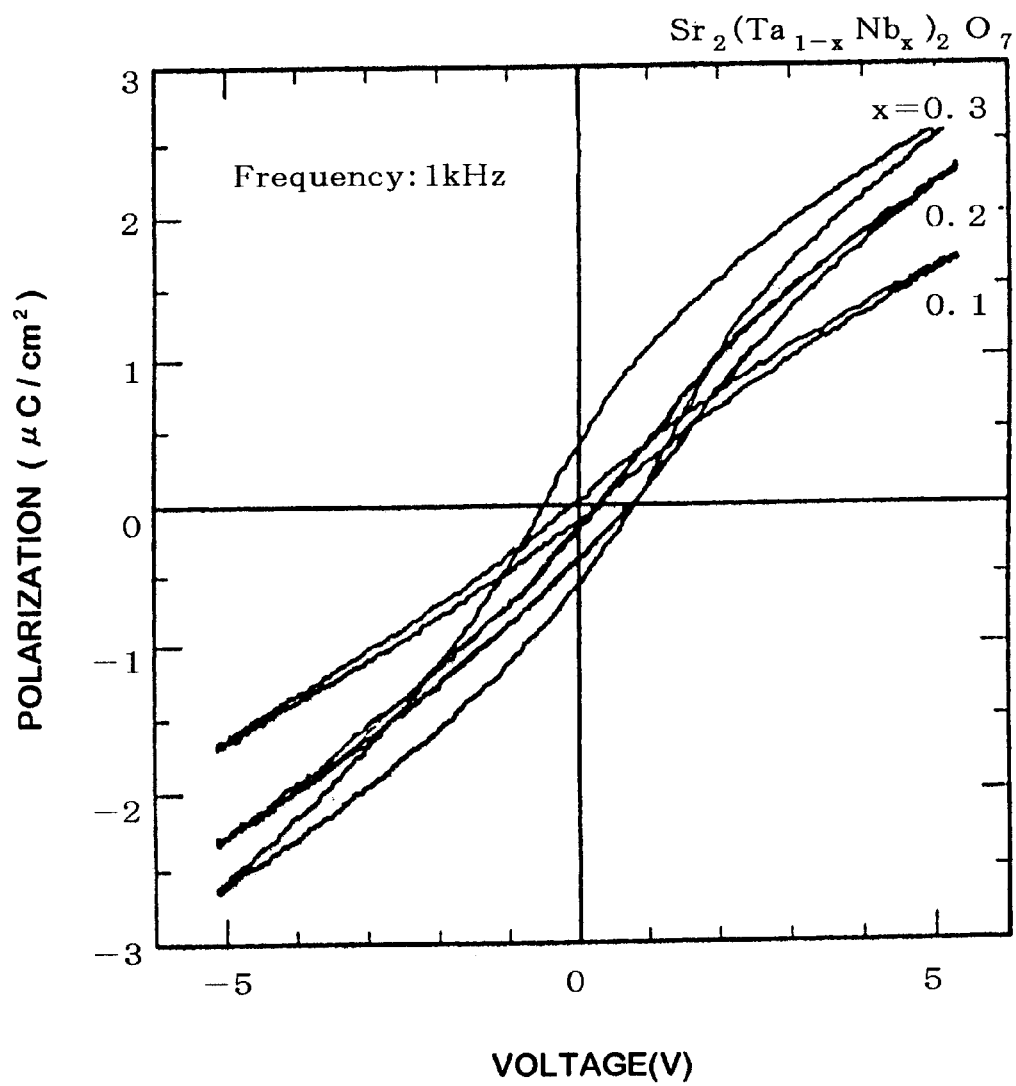
FIG. 9 is a graph showing a relationship between voltages applied to a thin film made of $Sr_2(Ta_{1-x}Nb_x)_2O_7$ and polarization states generated therein.

FIG. 9 is a graph showing a relationship between voltages applied to the thin film made of $Sr_2(Ta_{1-x}Nb_x)_2O_7$ and polarization states generated therein using the value x as a parameter. The relationship between the voltages and the polarization states is measured with a Sawyer tower circuit using a frequency of 1 KHz. The axis of abscissas shows the voltages, and the axis of ordinates represents the polarization states. The relationship between the voltages and the polarization states shows hysteresis characteristics when the values of x is in a range of $0.1 \leq x \leq 0.3$. According to FIG. 7, it is understood that curie temperature Tc of the thin film is in a range of 180° C. to 600° C. when the values of x are in a range of $0.1 \leq x \leq 0.3$ (As in FIG. 7, curie temperatures Tc of the thin film are either in the vicinity of 410° C. or 520° C. when the values of x are about 0.2 and 0.3 respectively).

On the contrary, no hysteresis characteristics are shown when the values of x are both about 0.4 and 0.6 (not shown). The phenomena might be caused due to high curie temperature Tc (As in FIG. 7, curie temperatures Tc of the thin film are either in the vicinity of 735° C. or 1000° C. when the values of x are about 0.4 and 0.6 respectively).

It is not preferable to set the value of x at an excessively small value because it leads to an undesirable decrease of curie temperature Tc. As it is understood from FIG. 9, remanent polarization Pr had the largest value such as 0.5 $\mu c/cm^2$ when the values of x were about 0.3. At that time, coercive field Ec was measured at 44 KV/cm.

Figure 10:
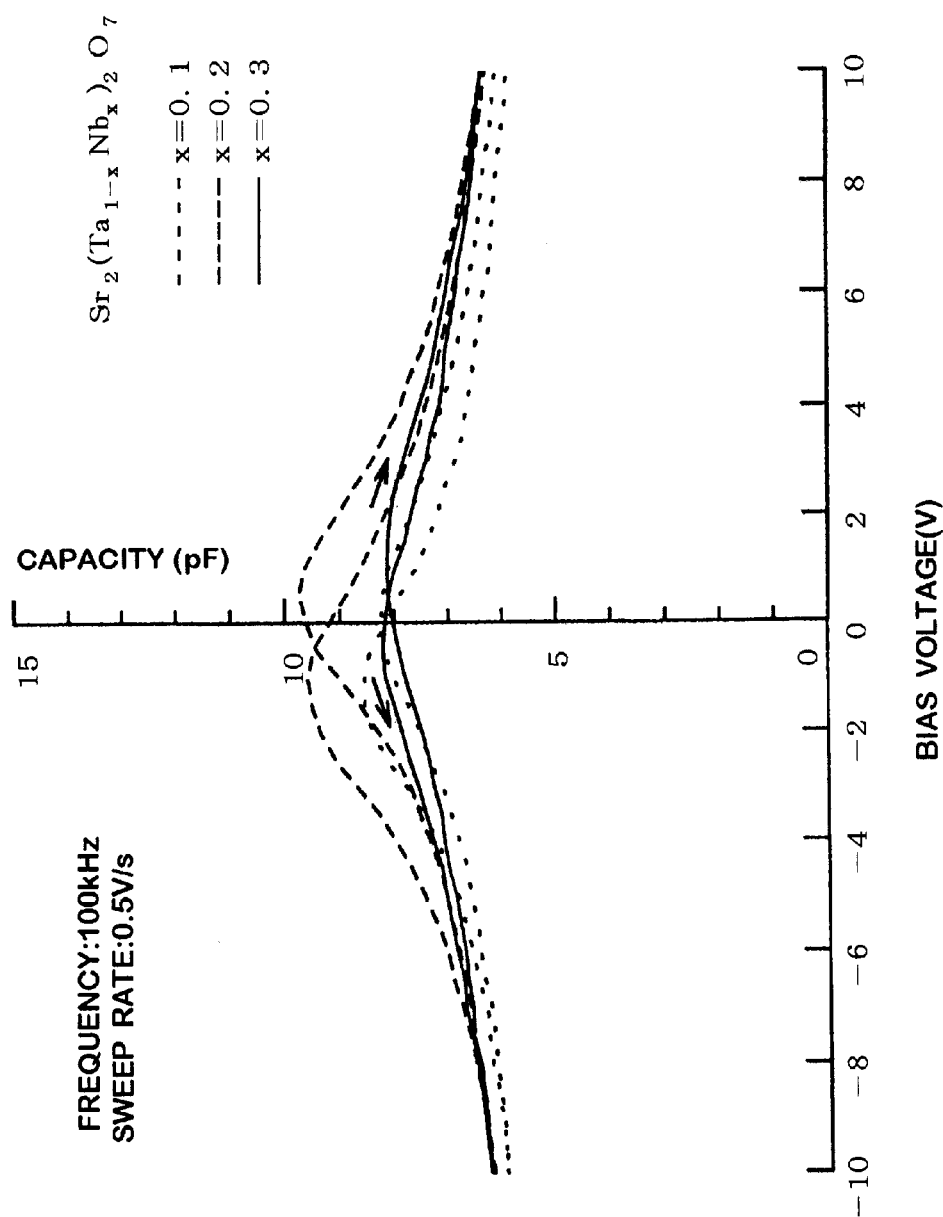
FIG. 10 is a graph showing a relationship between bias voltages applied to the thin film of $Sr_2(Ta_{1-x}Nb_x)_2O_7$ and capacitances thereof.

FIG. 10 is a graph showing a relationship between bias voltages applied to the thin film of $Sr_2(Ta_{1-x}Nb_x)_2O_7$ and capacitances thereof using the value x as a parameter. The relationship between the voltages and the capacitances is measured with an LCR meter generating 25 mV and 100 KHz (model No. HP4284A). The axis of abscissas shows the bias voltages, and the axis of ordinates represents the capacitances. Sweep rate of the measurement was 0.5V/second. It is clearly understood that the thin film being formed shows hysteresis characteristics when the values of x are in a range of $0.1 \leq x \leq 0.3$.

Relative dielectric constant $\epsilon r$ of the thin film was 53 when the value x is 0.3, the dielectric constant being calculated from the capacitance when OV is applied thereto as the bias voltage.

Figure 11:
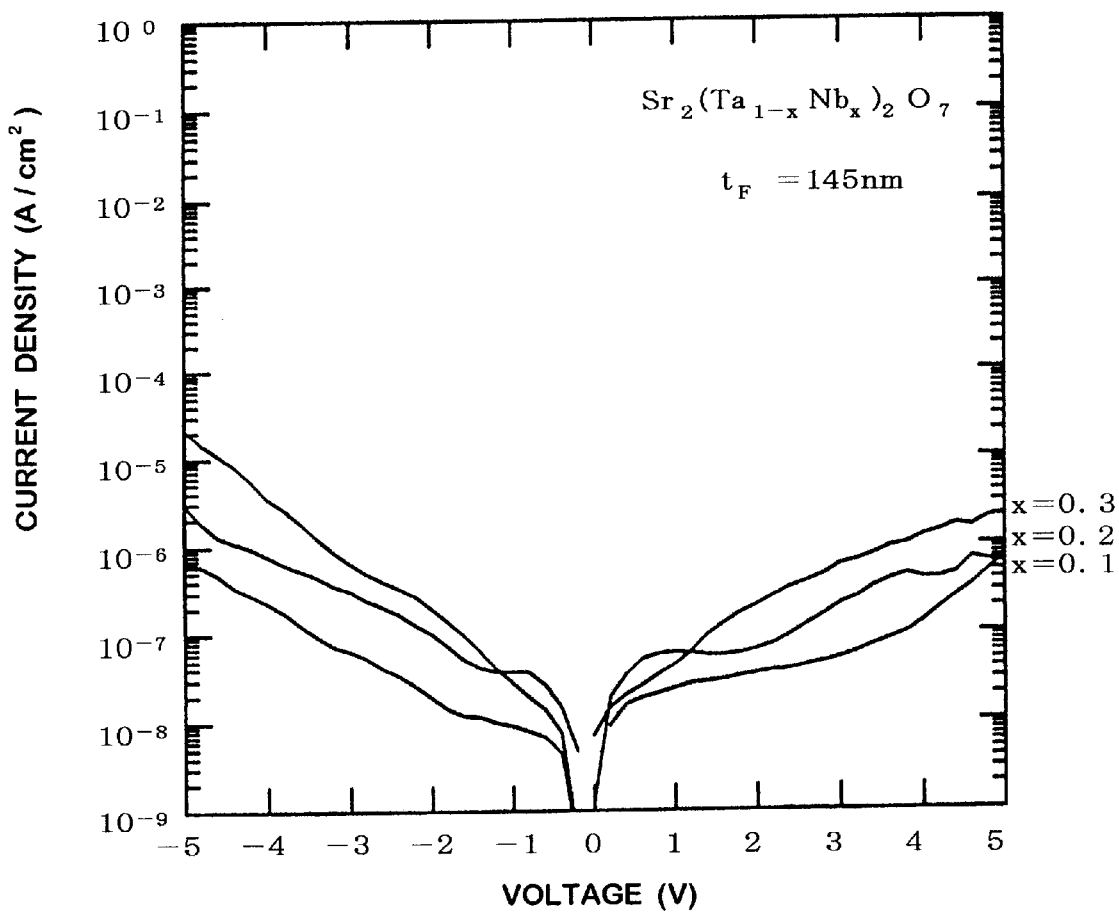
FIG. 11 is a graph showing leakage current characteristics of the thin film of $Sr_2(Ta_{1-x}Nb_x)_2O_7$.

FIG. 11 is a graph showing leakage currents of the thin film made of $Sr_2(Ta_{1-x}Nb_x)_2O_7$ using the value x as a parameter. The axis of abscissas shows the voltages, and the axis of ordinates represents density of the leakage currents. The density of the leakage currents is the highest value when the value x is 0.3, and it becomes the lowest value when the value x is 0.1. The results might be caused by measurement error. In any case, these leakage current density is a relatively small value such as equal to or less than $6 \times 10^{-7} A/cm^2$ when a voltage 3V (an electric field equivalent of approximately 200 KV/cm) is applied to the thin film.

Although, $Sr_2(Ta_{1-x}Nb_x)_2O_7$ is used as an example of the mixed crystal which can be expressed as $(A1_{y1}A2_{y2} \ldots An_{yn})_2 (B1_{x1}B2_{x2} \ldots Bm_{xm})_2O_7$ in the embodiments described above, the substance used for forming the thin film to realize the present invention is not limited to $Sr_2(Ta_{1-x}Nb_x)_2O_7$. For example, elements belonging to IIa group, IIIa group, and lanthanum series may be used as A1, A2, An of the mixed crystal expressed as $A1_{y1}A2^{y2} \ldots A_{yn})_2 (B1_{x1}B2_{x2} \ldots Bm_{xm})_2O_7$.

As the elements belonging to IIa group, Mg, Ca, Ba and the like may be used in addition to Sr. As the elements belonging to IIIa group, Sc, Y, La, Ac and the like can be used. Further, as the elements belonging to lanthanum series, Ce, Pr, Nd, Pm, Sm, Eu, Gd, Tb, La and the like may be used.

In addition to Nb and Ta, for example Ti, Zr, Hf, Y and the like may also be used as B1,B2 . . . Bm of the mixed crystal expressed as $A1_{y1}A2_{y2} \ldots An_{yn})_2 (B1_{x1}B2_{x2} \ldots Bm_{xm})_2O_7$.

In other words, the thin film can also be formed using mixed crystals composed any of $Ca_2Nb_2O_7$, $La_2Ti_2O_7$, $Ce_2Ti_2O_7$, $Pr_2Ti_2O_7$, $Nd_2Ti_2O_7$, $Sm_2Ti_2O_7$, $Gd_2Ti_2O$, $Y_2Ti_2O_7$ and the like in addition to $Sr_2Nb_2O_7$ and $Sr_2Ta_2O_7$.

Although, the thin film made of mixed crystal is designed so that the curie temperature Tc is in a range of 180° C.$\leq$x$\leq$600° C. in the embodiments described above, the curie temperature of the thin film used in the present invention is not limited to this temperature range. A ferroelectric thin film having the desired curie temperature Tc corresponding to the temperature at which the device being in operation is preferred.

Figure 12A:
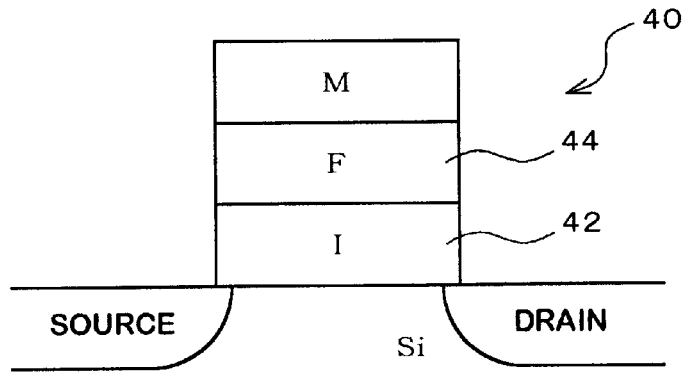
FIG. 12A is a view showing a structure of an FET in another embodiment of the present invention.
Figure 12B:
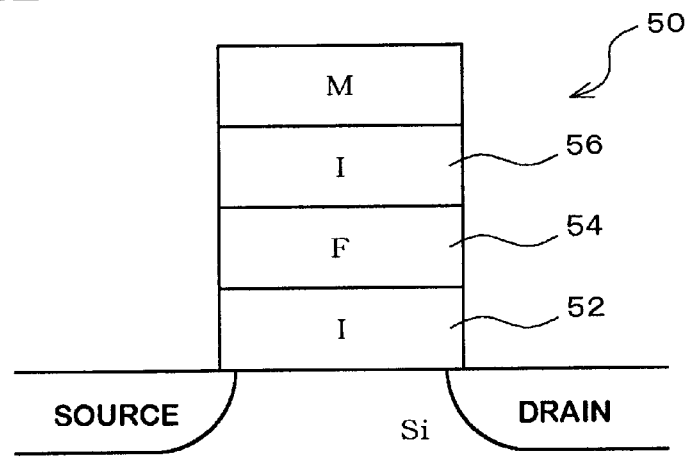
FIG. 12B is a view showing a structure of an FET in yet another embodiment of the present invention.
Figure 12C:
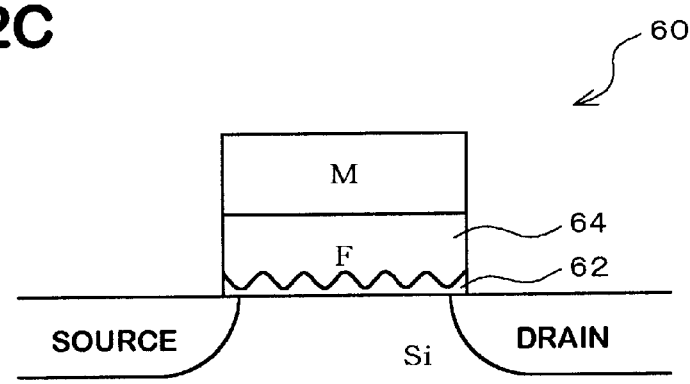
FIG. 12C is a view showing a structure of an FET in still another embodiment of the present invention.
Figure 13:
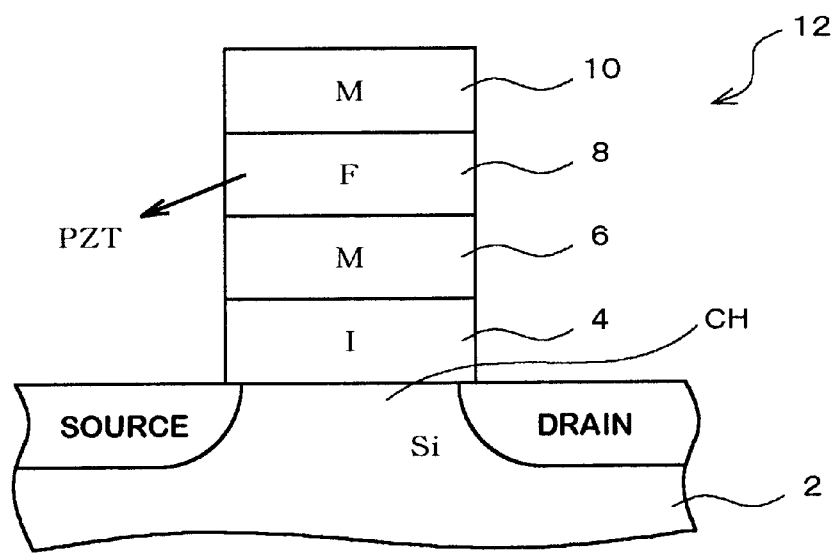
FIG. 13 is a view of an FET using the conventional ferroelectric layer.

Though, the ferroelectric thin film according to the present invention is applied to the FET 20 having the MFMIS structure in the embodiments described above, the application of the present invention is not limited to the FET having the structure. The present invention may also be applicable to FETs having other structures, such as any of the FET 40 having MFIS structure shown in FIG. 12A, the FET 50 having the MIFIS structure shown in FIG. 12B, and the FET 60 having the MFS structure shown in FIG. 12C.

The FET 40 having the MFIS structure is considered as an equivalent circuit in which a capacitor including an insulation layer 42, another capacitor which comprises a ferroelectric layer 44 is connected in series during the writing. The FET 50 having the MIFIS structure may also be considered as an equivalent circuit having a formation of connecting a capacitor which includes an insulation layer 52, another capacitor which comprises a ferroelectric layer 54, and still another capacitor which includes an insulation layer 56 in series during the writing.

The FET 60 having the MFS structure can further be considered as an equivalent circuit in which a capacitor including an insulation layer 62 and another capacitor which comprises a ferroelectric layer 64 is connected in series during the writing. The insulation layer 62 made of $SiO_2$ is formed unintentionally during a process of depositing the ferroelectric layer 64 on a semiconductor substrate 61 of silicon.

The application of the present invention is not limited to FETs including a ferroelectric layer. The present invention may also be applicable to other types of memory devices including a first capacitor having a ferroelectric layer and a second capacitor substantially connected to the first capacitor in series. In addition, the present invention is applicable generally to memory devices including a ferroelectric material.

The ferroelectric memory device in accordance with the present invention is characterized in that, a ferroelectric memory device includes a ferroelectric layer in which information being stored using its hysteresis characteristics, and the ferroelectric layer is composed of a mixed crystal defined by expressions of;

$A1_{y1}A2_{y2} \ldots An_{yn})_2 (B1_{x1}B2_{x2} \ldots Bm_{xm})_2O_7$, and x1+x2+ . . . +xm=1, and y1+y2+ . . . +yn=1, and each of x1,x2, . . . xm, y1,y2, . . . yn having a value equal to or greater than 0, and equal to or less than 1, and at least two of x1,x2, . . . xm, y1,y2, . . . yn having values greater than 0, and less than 1, and each of A1, A2, . . . , An being an element selected so as to be different from one another from a group consisting of elements belonging to IIa group, IIIa group, and lanthanum series, and each of B1, B2, . . . , Bn being an element selected so as to be different from one another from a group consisting of Ti, Nb, Ta, Zr, Hf, Y.

Therefore, the dielectric constant of the ferroelectric layer can be reduced by composing the ferroelectric layer with an $A_2B_2O_7$ type crystal. Also, the melting point of the ferroelectric layer may be increased. Further, characteristic values of the ferroelectric layer such as curie temperature related with ferroelectricity thereof can be controlled as desired by composing the layer with a mixed crystal. In this way, a ferroelectric layer having characteristics of desired ferroelectricity, a low dielectric constant, and a high melting point may be obtained.

Also, the ferroelectric memory device in accordance with the present invention is characterized in that, curie temperature Tc of the ferroelectric layer is in a range of about 180° C. to about 600° C. In this way, a ferroelectric layer which shows stable ferroelectricity within an operating range of −50° C. to +150° C. can be obtained.

Further, the ferroelectric memory device in accordance with the present invention is characterized in that, curie temperature Tc of the ferroelectric layer is in a range of about 500° C. to about 600° C. In this way, a ferroelectric layer which shows much stable ferroelectricity can be obtained.

The ferroelectric memory device in accordance with the present invention is characterized in that, the ferroelectric memory device includes a first capacitor having the ferroelectric layer, and a second capacitor connected to the first capacitor substantially in series, and information is stored in accordance with a divided voltage applied to the ferroelectric layer of the first capacitor by applying a voltage which corresponds to the information to be stored to both ends of the first capacitor and the second capacitor connected in series.

In other words, the information is stored in accordance with the divided voltage applied to the ferroelectric layer of the first capacitor by applying a voltage corresponding to the information to be stored to both ends of the first capacitor and the second capacitor connected in series.

Therefore, the divided voltage applied to the first capacitor can be increased using a ferroelectric layer having a low dielectric constant. In this way, polarization reversal of the ferroelectric layer can be caused easily during the writing. As a result, storing information into the ferroelectric memory device can be carried out easily.

Also, the ferroelectric memory device in accordance with the present invention is characterized in that, the ferroelectric memory device comprises, a source region, a drain region, a channel region formed between the source region and the drain region, a substantially insulation layer disposed on the channel region, a ferroelectric layer disposed above the substantially insulation layer, and an upper conductive layer disposed on the ferroelectric layer.

Therefore, the probability of lattice defects in a ferroelectric layer once formed is decreased in an FET requiring heat treatment after forming the ferroelectric layer by using the ferroelectric layer having a high melting point. In this way, it is possible to obtain a ferroelectric memory device with high reliability.

Further, the ferroelectric memory device in accordance with the present invention is characterized in that, the ferroelectric memory device has a lower conductive layer between the substantially insulation layer and the ferroelectric layer. In this way, it is possible to obtain a ferroelectric memory device with much higher reliability by fabricating it with a structure so called MFMIS (Metal Ferroelectric Metal Insulator Silicon).

The ferroelectric memory device in accordance with the present invention is characterized in that, the ferroelectric layer is composed of a mixed crystal defined by expressions of;

$Sr_2(Ta_{1-x}NB_x)_2O_7$, and the value of x is 0<x<1.

Consequently, a ferroelectric layer which shows ferroelectricity at a desired temperature range can be formed easily using a mixed crystal composed of $Sr_2Nb_2O_7$ indicating a high curie temperature Tc and $Sr_2Ta_2O_7$ having a low curie temperature Tc.

Also, the ferroelectric memory device in accordance with the present invention is characterized in that, the value of x is in a range of about 0.1 to about 0.3. It is, therefore, possible to form a ferroelectric layer which shows ferroelectricity at room temperature by controlling a mixture ratio of the mixed crystal within the range.

Further, the ferroelectric memory device in accordance with the present invention is characterized in that, the value of x is about 0.3. It is, therefore, possible to form a ferroelectric layer which shows much higher ferroelectricity at room temperature by controlling a mixture ratio of the mixed crystal to the value.

The method of manufacturing a ferroelectric memory device in accordance with the present invention is characterized in that, the method comprises the steps of:
providing the ferroelectric layer by carrying out a step (d) after forming an amorphous layer having a desired thickness by carrying out steps (a) to (c) for one of once and predetermined times,
(a) coating mixed-metal alkoxide composed of Sr, Ta, and Nb which being dissolved in a solvent on a base substance,
(b) evaporating the solvent,
(c) removing organic elements by heat treatment,
(d) carrying out annealing for crystallization at a temperature above a temperature to be crystallized. In this way, a ferroelectric layer having characteristics of a low dielectric constant, a high melting point, and desired ferroelectricity can be formed in a desired thickness.

While the invention has been described in its preferred embodiments, it is to be understood that the words which have been used are words of description rather than limitation and that changes within the purview of the appended claims can be made without departing from the true scope and spirit of the invention in its broader aspects.

What is claimed is:

1. A ferroelectric memory device including a ferroelectric layer in which information being stored uses its hysteresis characteristics, wherein the ferroelectric layer is composed of a mixed crystal defined by expressions of;

$(A1_{y1}A2_{y2} \ldots An_{yn})_2 (B1_{x1}B2_{x2} \ldots Bm_{xm})_2O_7$, and wherein x1+x2+ . . . +xm=1, and wherein y1+y2+ . . . +yn=1, and wherein each of x1, x2, . . . xm, y1, y2, . . . yn has a value equal to or greater than 0, and equal to or less than 1, and wherein at least two of x1, x2, . . . xm, y1, y2, . . . yn have values greater than 0, and less than 1, and wherein each of A1, A2, . . . , An is an element selected so as to be different from one another from a group consisting of elements belong to IIa group, IIIa group, and lanthanum series, where IIIa group consists of Sc, Y, La, and Ac, and wherein each of B1, B2, . . . , Bn is an element selected so as to be different from one another from a group consisting of Ti, Nb, Ta, Zr, Hf, Y, wherein the ferroelectric memory device includes a first capacitor having the ferroelectric layer, and a second capacitor connected to the first capacitor substantially in series, and wherein information is stored in accordance with a divided voltage applied to the ferroelectric layer of the first capacitor by applying a voltage which corresponds to the information to be stored to both ends of the first capacitor and the second capacitor connected in series.

2. The ferroelectric memory device in accordance with claim 1, wherein curie temperature Tc of the ferroelectric layer is in a range of about 180° C. to about 600° C.

3. The ferroelectric memory device in accordance with claim 2, wherein curie temperature Tc of the ferroelectric layer is in a range of about 500° C. to about 600° C.

4. The ferroelectric memory device in accordance with claim 1, wherein the ferroelectric memory device comprises,
a source region,
a drain region,
a channel region formed between the source region and the drain region,
a substantially insulation layer disposed on the channel region,
a ferroelectric layer disposed above the substantially insulation layer, and
an upper conductive layer disposed on the ferroelectric layer.

5. The ferroelectric memory device in accordance with claim 4, wherein the ferroelectric memory device has a lower conductive layer between the substantially insulation layer and the ferroelectric layer.

6. The ferroelectric memory device in accordance with claim 1, wherein the ferroelectric layer is composed of a mixed crystal defined by expressions of;

$Sr_2 (Ta_{1-x}Nb_x)_2O_7$, and wherein the value of x is 0<x<1.

7. The ferroelectric memory device in accordance with claim 6, wherein the value of x is in a range of about 0.1 to about 0.3.

8. The ferroelectric memory device in accordance with claim 7, wherein the value of x is about 0.3.

9. The ferroelectric memory device in accordance with claim 6, wherein curie temperature Tc of the ferroelectric layer is in a range of about 180° C. to about 600° C.

10. The ferroelectric memory device in accordance with claim 9, wherein curie temperature Tc of the ferroelectric layer is in a range of about 500° C. to about 600° C.

11. The ferroelectric memory device in accordance with claim 6, wherein the ferroelectric memory device comprises,
a source region,
a drain region,
a channel region formed between the source region and the drain region,
a substantially insulation layer disposed on the channel region,
a ferroelectric layer disposed above the substantially insulation layer, and
an upper conductive layer disposed on the ferroelectric layer.

12. The ferroelectric memory device in accordance with claim 11, wherein the ferroelectric memory device has a lower conductive layer between the substantially insulation layer and the ferroelectric layer.

* * * * *